United States Patent [19]

Honnigford et al.

[11] 4,397,076

[45] Aug. 9, 1983

[54] METHOD FOR MAKING LOW LEAKAGE POLYCRYSTALLINE SILICON-TO-SUBSTRATE CONTACTS

[75] Inventors: Edward H. Honnigford, Dayton, Ohio; Vinod K. Dham, Fremont, Calif.

[73] Assignee: NCR Corporation, Dayton, Ohio

[21] Appl. No.: 301,557

[22] Filed: Sep. 14, 1981

[51] Int. Cl.³ .................... H01L 21/22; H01L 21/265
[52] U.S. Cl. ........................................ 29/571; 29/591; 148/187
[58] Field of Search ...................... 29/571, 591, 576 B; 148/187, 188, 1.5

[56] References Cited

U.S. PATENT DOCUMENTS

| | | | |
|---|---|---|---|
| 4,127,931 | 12/1978 | Shiba | 29/571 |
| 4,138,782 | 2/1979 | Dela Moneda | 29/571 |
| 4,192,059 | 3/1980 | Khan et al. | 29/571 |
| 4,246,044 | 1/1981 | Yanase | 29/571 X |
| 4,282,648 | 8/1981 | Yu et al. | 29/571 |
| 4,341,009 | 7/1982 | Bartholomew et al. | 29/591 X |

Primary Examiner—G. Ozaki
Attorney, Agent, or Firm—J. T. Cavender; Philip A. Dalton; Casimer K. Salys

[57] ABSTRACT

A process for making buried contacts without damaging the surface of the silicon substrate while etching the pattern of a poly interconnect layer. The contact cut made in the gate oxide layer covering the substrate is made smaller than the poly deposited and patterned thereover. Damage to the substrate surface during the etching of the poly layer pattern is prevented by the presence of the gate oxide layer between the poly layer and the substrate. An ion implantation step performed early in the process forms a parasitic depletion mode channel under the region having an overlap of poly onto gate oxide. Consequently, though the gate oxide prevents the direct diffusion of dopant into the underlying substrate when conductors are formed by doping, the parasitic channel ohmically couples the poly interconnect layer to the diffused region in the substrate. The latter region is usually the S/D electrode of an IGFET. The composite process is compatible with the formation of self-aligned gates and conductively doped poly and substrate regions which are simultaneously doped with the same impurity.

6 Claims, 12 Drawing Figures

U.S. Patent  Aug. 9, 1983  Sheet 1 of 4  4,397,076
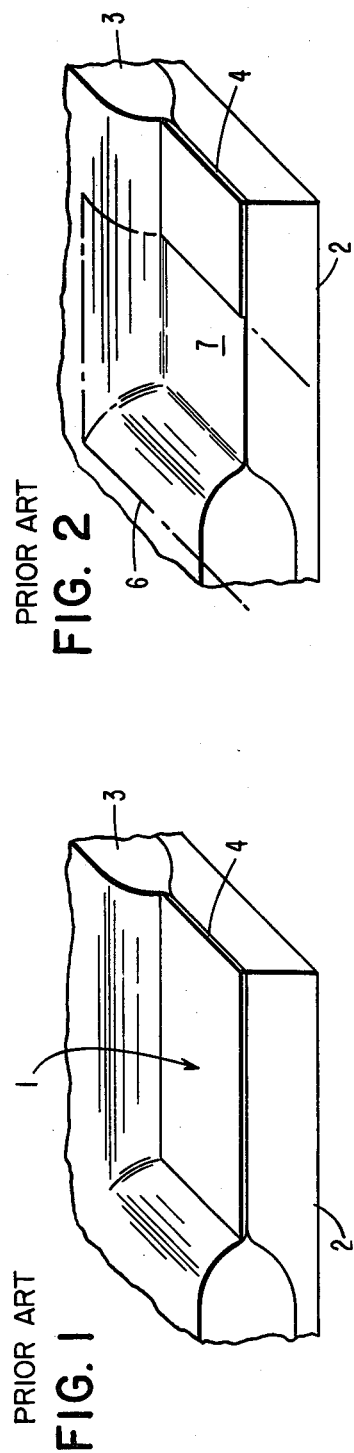
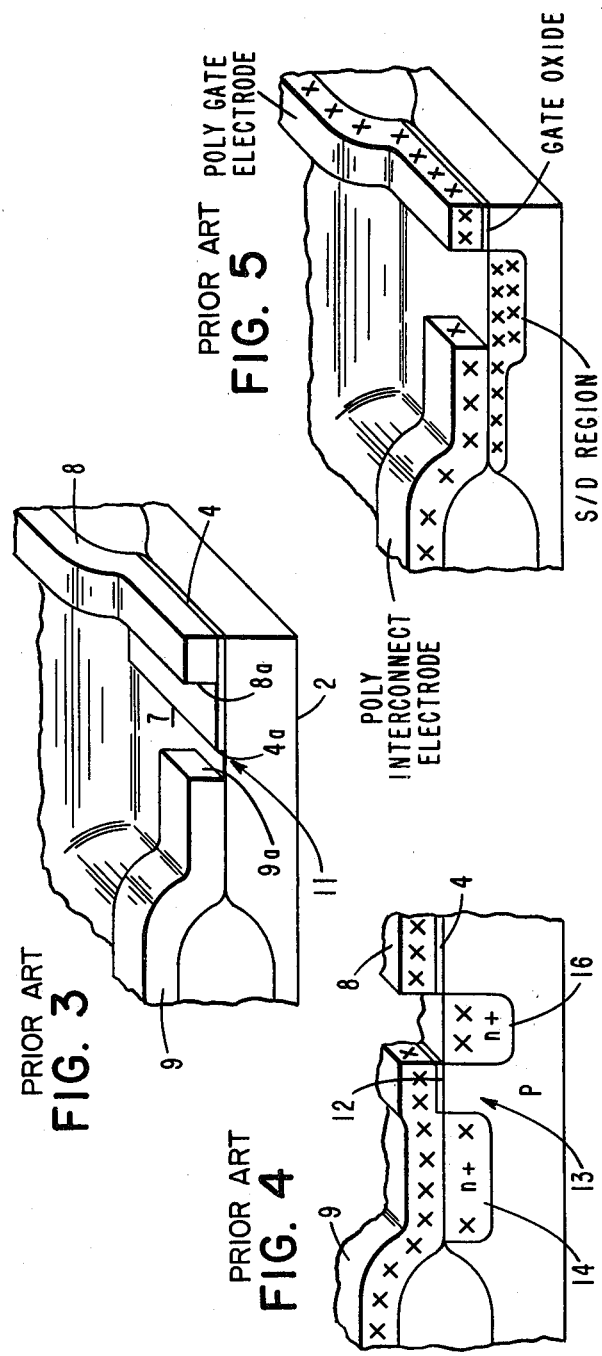
PRIOR ART FIG. 1
PRIOR ART FIG. 2
FIG. 3
PRIOR ART FIG. 4
PRIOR ART FIG. 5

METHOD FOR MAKING LOW LEAKAGE POLYCRYSTALLINE SILICON-TO-SUBSTRATE CONTACTS

BRIEF SUMMARY

The invention, as described and illustrated hereinafter, relates to a process for forming buried contacts in a semiconductor wafer during the fabrication of integrated circuits (ICs). More particularly, the process in one form encompasses a sequence of steps to form a structure by which ohmic contact is made between doped polycrystalline silicon (poly) interconnect layers and doped regions in the monocrystalline silicon substrate without damaging the immediately adjacent areas of the substrate. In particular, the process avoids the surface damage produced during the etching the poly to define the contact shape. The process lends itself to the fabrication of insulated gate field effect transistors (IGFETs) having self-aligned gates and single impurity type poly throughout. Furthermore, the new process retains the sequence of steps by which one simultaneously dopes the poly layers, the source/drain (S/D) regions and any other conductive regions in the substrate.

The new process involves an implant step early in the fabrication of the wafer, which step forms a parasitic depletion channel adjacent the substrate surface substantially surrounding the area of the intended contact cut. Later in the processing, a contact cut is made through a protective dielectric layer using patterned photoresist and an etchant which does not attack the silicon substrate. This exposes the surface of the underlying substrate at the area of the contact cut. The first poly layer is then deposited on the wafer. During the photoresist patterning and poly etch sequence which follows, the poly covering the exposed substrate, at the contact cut, remains and extends therefrom to slightly overlap the adjacent dielectric layer. In this way, the substrate surface in the cut is masked by the poly and, therefore, is not attacked by the etchants used to remove the unwanted areas of poly, which etchants would otherwise readily attack the substrate silicon. Succeeding process steps remove the exposed dielectric and diffuse dopants into areas of exposed poly and substrate.

During normal processing the poly serves as an etchant mask when the dielectric layer is etched. This unetched dielectric serves as a dopant barrier during the subsequent diffusion of dopant into the exposed poly and substrate. Thereby, the dielectric surrounding the contact cut normally prevents the dopant from reaching the substrate immediately beneath, and in effect ohmically decouples the poly layer, connected through the contact cut, from the doped region in the substrate. According to the invention, however, an ion implantation performed earlier in the process insures the presence of a parasitic depletion type channel, to conductively link the poly-to-substrate junction occurring at the contact cut with the immediately adjacent conductively doped region in the substrate. Usually, this adjacent region is the S/D electrode of an IGFET.

Though the parasitic IGFET joining the poly interconnect electrode to the conductivity doped region in the substrate is limited in its current carrying capacity, when the conductive region is the S/D region of the IGFET, that region is simultaneously accessible through paths of conductively doped regions in the substrate. Consequently, the IGFET S/D electrode may be connected directly along high current doped paths in the substrate, or low current poly interconnect paths, without complicating the overall fabrication process or introducing surface damage into the substrate. These and other beneficial aspects of the invention will become clearer upon understanding the development contained hereinafter.

DESCRIPTION OF THE DRAWINGS

FIGS. 1-5 contain orthogonally sectioned perspective views of an IGFET device, schematically illustrating the important stages in a process formerly used to fabricate contacts between the poly layers and diffused regions in the substrate.

DETAILED DESCRIPTION

Figure 6:
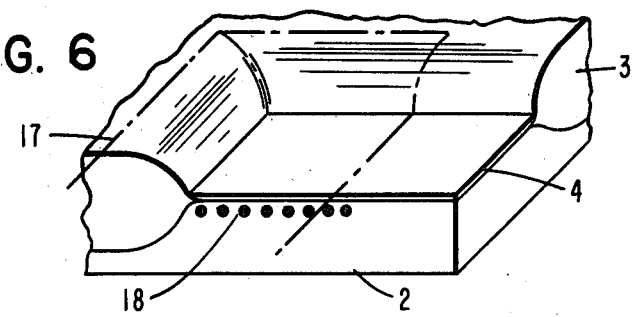
FIGS. 6-9 contain a similar grouping of orthogonally sectioned perspective views, schematically illustrating an approach for making contacts according to one embodiment of the present invention.

The present invention relates to the making of electrically conductive contacts in integrated circuits for the purpose of joining conductively doped poly interconnect layers with conductively doped regions in the silicon substrate. More particularly, the invention as embodied discloses a process for making contacts between a poly layer and a diffused S/D contact of an IGFET, in the course of utilizing the well-known local oxidation of silicon (LOCOS) process, to fabricate IGFETs with identical impurity type poly layers and self-aligned gate structures. The distinctions between the method formerly used and that presented here will be more clearly understood after considering the approaches individually.

First, consider the general approach formerly pursued and its effect on the IGFET performance. FIGS. 1, 2, 3 and 5 summarize the important stages in the fabrication of an IGFET device according to the former practice, with particular interest centering on the formation of the contact between the poly layer and the substrate. These figures present the structure in the perspective, with sections taken along orthogonal planes. FIG. 1 schematically illustrates a stage in the course of LOCOS processing, showing with particularity one corner of an active region. The active region, generally 1, of substrate 2 is bordered by a field region of thermally-grown silicon dioxide (field oxide), 3. Ion implantations to establish well and channel stoppers under the field oxide were performed earlier in the process according to established LOCOS techniques. Gate dielectric layer 4 of silicon dioxide (gate oxide) covers the exposed surface of active region 1.

Departing briefly, it may be helpful to understand some of the ensuing procedural steps if the relative dimensions of the various layers are perceived. It should also be noted at this point, that the figures are not scale representations of the actual structures, but rather, general depictions of their organization to provide insight into the effects of successive processing stages. An exemplary embodiment includes a gate oxide layer of approximately 700 Angstroms, a field oxide with a thickness in the range of 13,000 Angstroms, and poly layers, described hereinafter, having thicknesses of approximately 4,000 Angstroms each.

In the course of understanding the various steps characterizing the former process, it should not be overlooked that certain procedural steps and structural organizations of IGFETs are preferred. For instance, one seeks to develop a process which simultaneously forms the poly layer for both the gate electrode and the interconnect electrodes, a process which insures that the gate electrodes, the interconnect electrodes and the conductive regions in the substrate are simultaneously doped with the same impurity type, and a process which prescribes a step sequence by which self-aligned gate structures are formed. To accommodate these numerous ends, the former processes described a relatively large contact cut in the intended S/D region of the IGFET. The pattern of the cut, illustrated by outline 6 in FIG. 2, is generated in conventional manner using a photoresist mask and a wet etch of hydrofluoric (HF) acid to remove exposed silicon dioxide. The duration of the oxide etch is clearly selected to expose the substrate surface in region 7, without making undue penetration into the significantly thicker field oxide, 3. The HF acid etchant normally used to remove the area of gate oxide does not attack or appreciably react with surface 7 of substrate 2. The problems inherent in the former process are typically introduced at the next step in the fabrication process, the deposition and definition of the poly layer.

The depiction in FIG. 3 shows the poly layer after it has been deposited and patterned using conventional photolithographic techniques. Note the presence of gap or separation, designated generally as region 11, between edge 8A of gate electrode poly layer 8 and edge 9A of S/D interconnect poly layer 9. It is no doubt apparent that any overlap between the two would produce a gate-to-S/D short circuit after the doping of the poly. A typical dimension for the gap separating the two lies in the range of 4 microns. Similarly, note the exposure of substrate surface 7 in region 11 between edge 4A of gate oxide layer 4 and edge 9A. The typical separation between edges 4A and 9A is approximately 1 micron, and is dictated to a large part by the precision of the processing equipment.

The exposure of substrate surface 7 in region 11 is intentional when proceeding according to the former process. FIG. 4 illustrates the effects if poly layer 9 were allowed to overlap gate oxide layer 4 in region 11. Exposed gate oxide, i.e. gate oxide 4 not covered by poly layers such as 8 or 9, is normally etched away with HF acid. This exposes substrate surface to the doping step which follows. However, any gate oxide which is covered by a poly layer remains, e.g., segment 12 in FIG. 4. Unfortunately, when the poly layers and exposed substrate are subjected to doping, gate oxide segment 12 acts as a dopant barrier. The dopant impurities, symbolically shown as "Xs," do not penetrate gate oxide segment 12 in region 13, and effectively prevent the formation of a conductive path between doped contact region 14 and doped S/D region 16. FIG. 4 illustrates the problem in the context of an n-channel IGFET. The different depths of diffusedly doped regions 14 and 16 show the effect of poly layer 9 on the penetration of dopant.

FIG. 5 illustrates the structure of the junction between the poly interconnect and the S/D region of the principal IGFET when the former process is followed. Namely, the structure in FIG. 3 followed by an oxide etch and doping of the exposed poly and substrate. Undoubtedly one recognizes that doping can be performed by either an ion implantation or a diffusion process.

As was noted previously, the former process specifically avoids such overlaps of interconnect poly and gate oxide by leaving a 1 micron separation in region 11. However, processing with exposed substrate surfaces itself introduces detracting characteristics into the performance of the principal IGFET being fabricated. To a great extent, this is attributable to the effects of the carbon tetrachloride gas plasma etchant used to remove unwanted poly in the course of patterning regions such as 8 and 9. This etchant is also an effective etchant of the monocrystalline silicon in substrate 2. Consequently, in the course of removing unwanted poly to defining the electrodes and interconnects, while avoiding the problem illustrated in FIG. 4, surface 7 of substrate 2 is subjected to varying degrees of etching. The pits and cracks in surface 7 caused by such etching are often aggravated in degree by process limitations related to layer depth tolerances, end point detection accuracies and overetching requirements.

The effects of these substrate surface damages appear later as degradations in the electrical performance of the principal IGFET. Exemplary degradations include excessive leakage currents, early breakdowns and unreliable reproducibility of other junction characteristics. With the trend toward higher circuit impedances and data storage using intrinsic capacitive characteristics, the IGFET performance requirements are becoming less tolerant of leakage currents.

At this point it may be of value to briefly summarize the former steps which produce the configuration in FIG. 5. They include the use of the LOCOS process to define active regions and form gate oxides layers, followed by a relatively large contact cut to expose the substrate, the deposition of a poly layer, the definition and etching of the poly layer to prescribed spacing, the removal of residual gate oxide, and the simultaneous diffusion of dopants into the poly and exposed substrate.

The process described above may also be extended to encompass structures with multiple poly layers. For instance, by forming or depositing other dielectric layers over the structure in FIG. 3, depositing a second poly layer, defining and etching the second poly layer, and then removing all exposed dielectrics, including both gate oxide layer 4 and the other dielectric layers, the structure remaining has multiple poly layers. Thereafter, the doping, metalization and surface passivation steps follow in the customary manner. It should not be overlooked that neither the single nor multiple poly layer versions of the former process mitigate the damage caused in the surface of the substrate.

Given that one now has a fundamental understanding of the former process used to fabricate IGFETs and their interconnections, attention will now focus on an embodiment of the invention at hand by developing the distinctions from the starting structure depicted in FIG. 1. Thereafter, the IGFET formed according to the new process will be described in the context of an exemplary application for which its unique characteristics are particularly suited. The embodiment will be presented in the context of fabricating an n-channel IGFET with a single poly layer used to form both the gate electrode and a S/D interconnect electrode. The interchangeability of dopant and dielectric materials is, no doubt, self-evident. Likewise, an extension of the embodiment to a multiple poly layer configuration is also believed to be within the ready comprehension of one skilled in the art, given the previous description and that which follows.

To understand the distinctions, begin with the LOCOS type structure depicted in FIG. 1 and consider the various processes applied thereto. The former process included a pair of early ion implantation steps which did not seek to alter the shape of the IGFET or contact. The first served to adjust the IGFET threshold levels, while the second determined which of the principal IGFETs were to be enhancement and depletion mode devices. Typically, the first implant involved boron ions with an energy of approximately 40 keV and dose of $4.3 \times 10^{11}$ cm$^{-2}$ over the complete wafer. Following this blanket implant, phosphorus ions were implanted with an energy of approximately 140 keV and a dose in the range of $1.3 \times 10^{12}$ cm$^{-2}$ by masking all but the channel regions of those IGFET devices which were subsequently to operate in a depletion mode. According to the former process, during this depletion implant the active regions of the enhancement mode devices were completely masked with photoresist. The implant of phosphorus into the gate regions of the depletion IGFETs was sufficiently great to overcome the boron doping effects introduced previously.

The first significant departure in the process presently disclosed occurs immediately prior to the latter described depletion implant step. Instead of being completely masked, selected areas of the S/D regions of the enhancement mode IGFETs are now exposed to the phosphorus ion implantation. Preferably, for the enhancement mode devices, the areas exposed to the implant should extend beyond the area over which the poly interconnect and substrate are to be joined, yet, not extend into any area which will later constitute a portion of the IGFET channel proper. For the embodying n-channel, enhancement mode IGFET, the area exposed through the ion implantation mask is shown by dashed line 17 in FIG. 6. The light, depletion doping by the n-type phosphorus ions is represented by dots 18. The active regions of the depletion mode devices may be completely exposed or tailored to suit the threshold voltage requirements.

Figure 7:
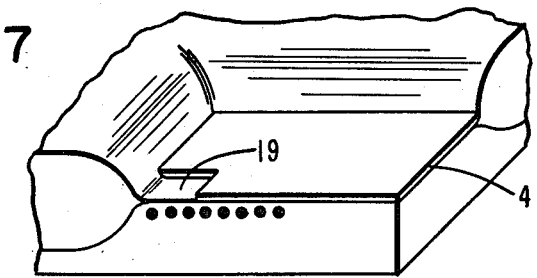
Figure 10:
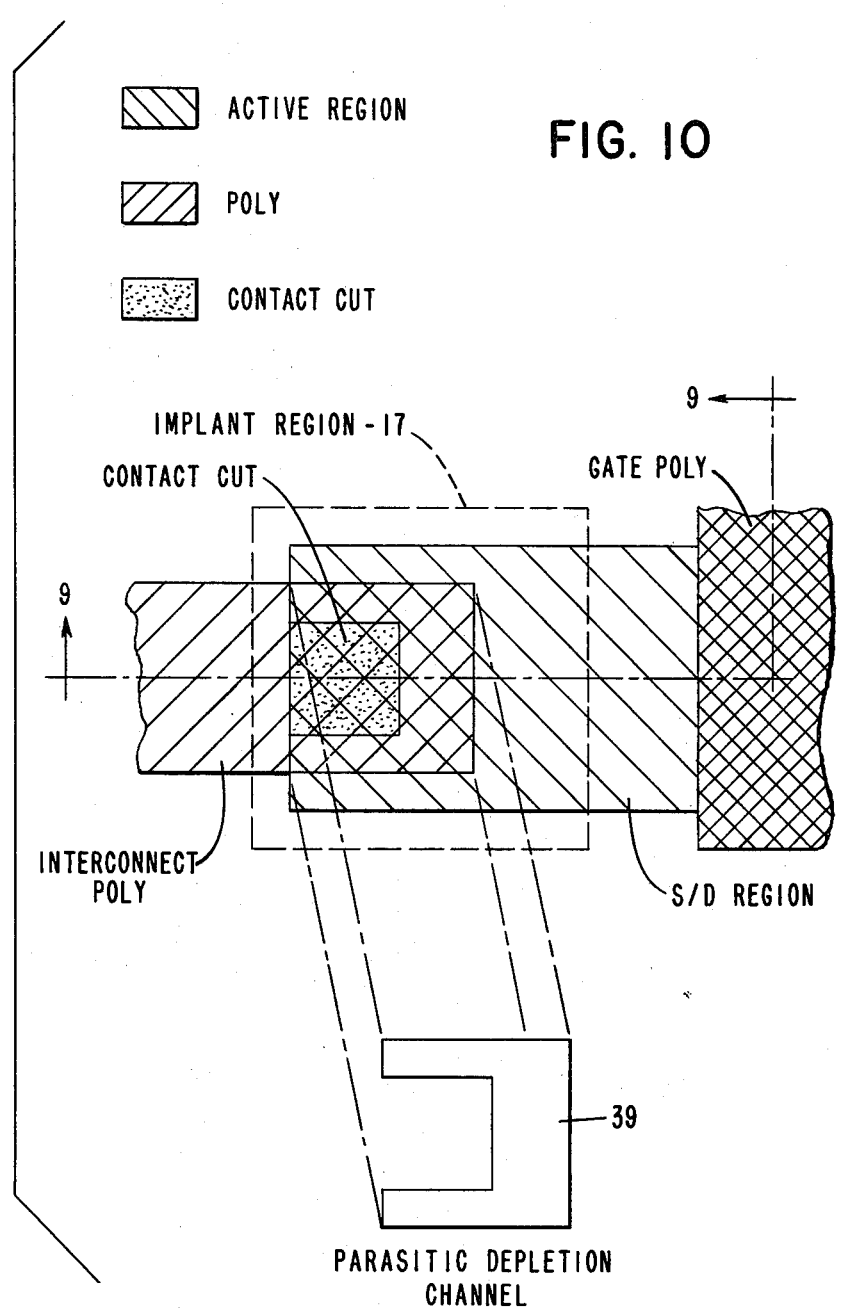
FIG. 10 schematically illustrates the relative patterns in the area of the contact cut, when viewed from above.

Whereas the contact cut through oxide layer 4 in FIG. 2 of the former process sought to expose a substrate surface area 7 greater than the intended contact area joining the poly interconnect to the substrate surface, the contact cut for the present invention embodiment is significantly smaller. By intent, the masking and HF acid etching steps expose a substrate surface area 19 of a sufficiently small size that it will remain covered by poly interconnect 21 after the poly is patterned. See FIGS. 7 and 8. At this point, it may also be useful to refer to the top view of the layout as presented in FIG. 10. Note from FIG. 10 that the embodiment provides for a contact cut area smaller than the poly interconnect area, which is itself smaller than the implant region. The implications become more apparent when one recalls that the etchants used to remove residual silicon dioxide layer 4 do not attack monocrystalline silicon.

Figure 8:
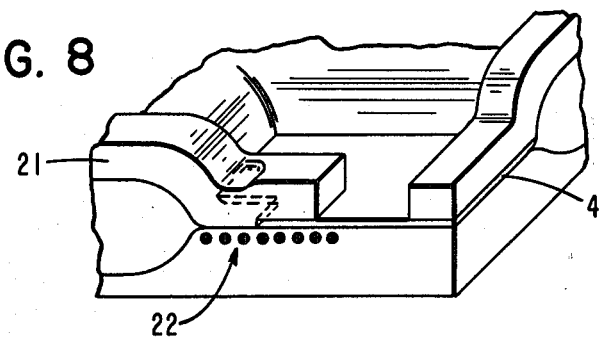

The structure illustrated in FIG. 8 shows the presence of a single layer of poly which has been deposited, masked, and then etched to produce the interconnect and gate electrode patterns sought. According to the embodiment, interconnect poly 21 in the area of contact 22 completely overlaps gate oxide 4, and thereby prevents the carbon tetrachloride gas plasma etch used to remove unwanted poly from reaching surface 19 of substrate 2. Consequently, no surface damage occurs. Though it is possible to leave poly outside the area implanted with phosphorus ions 18, it is preferred from the standpoint of creating the greatest effective channel width that substantially all interconnect poly 21 in the active region fall within the implanted area. Refer again to FIG. 10.

Consistent with the process steps formerly followed, any exposed oxide is removed with an HF acid etch. Thereafter, phosphorus, n-type dopant, is diffused into the exposed poly and substrate. The result is shown in FIG. 9.

Figure 9:
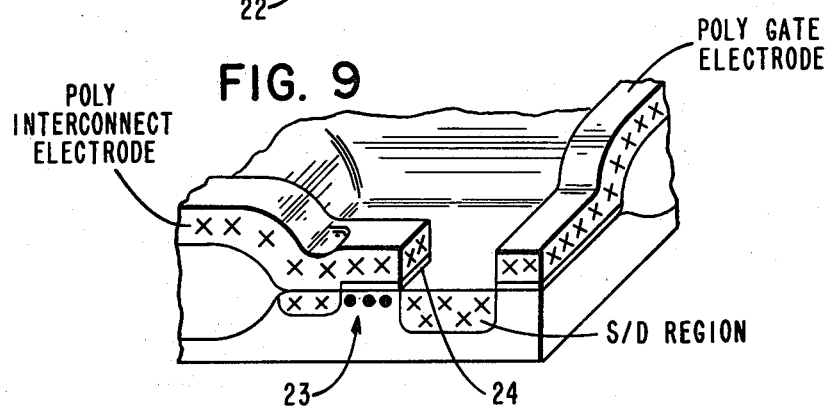

It is fairly clear from the structure in FIG. 9 that the diffused S/D region of the IGFET is again physically separated from the poly interconnect electrode. In this case, however, the two are joined through an electrically conductive, parasitic depletion channel, generally designated as 23. Though the phosphorus dopant again did not diffuse through oxide layer 24, the timely implant earlier in the process, incorporated without a significant departure from the basic sequence of the former process, forms an electrically conductive connection via channel 23. Since the parasitic channel and other depletion mode IGFETs were simultaneously implanted, the channel exhibits the typical $-3$ volt threshold corresponding to the common dosage of impurity.

Figure 11:
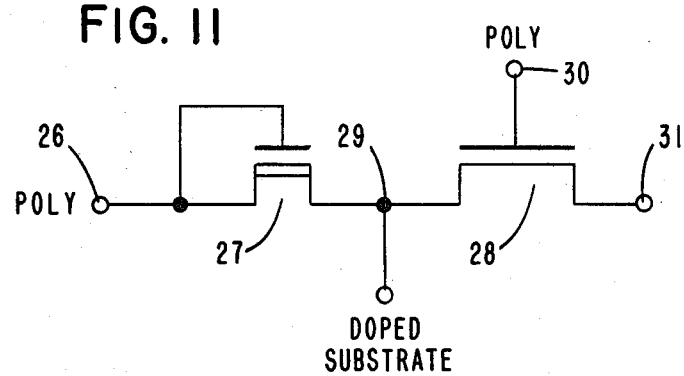
FIG. 11 presents the equivalent electronic schematic for a complete IGFET having a poly contact fabricated in the manner disclosed herein.

FIG. 11 is a schematic showing the equivalent electrical circuit for the structure appearing in FIG. 9. Node 26 corresponds to poly interconnect electrode 21 in FIG. 8. Parasitic depletion IGFET 27 represents parasitic channel 23 in FIG. 9. Node 29 represents the S/D electrode of the principal IGFET, which is designated by reference numeral 28. Node 30 corresponds to the poly gate electrode in FIG. 9. The remaining S/D electrode for IGFET 28, shown as node 31, preferably constitutes a diffused region in the substrate. No doubt one recognizes at this point that another parasitic IGFET, such as 27, will be created at 31 if that S/D region is coupled in the manner described hereinbefore. This form of versatility provides the IC designer with significant latitude in prescribing the circuit layout and device functions.

Recognizing that some parasitic depletion channels are limited in their current carrying capacity, it is of value to consider at least some of the implications on the circuit configurations. Though any low current application is generally suitable, the use of an interconnect poly coupled through a parasitic channel is particularly compatible with the load characteristics of IGFET gate electrodes.

Figure 12:
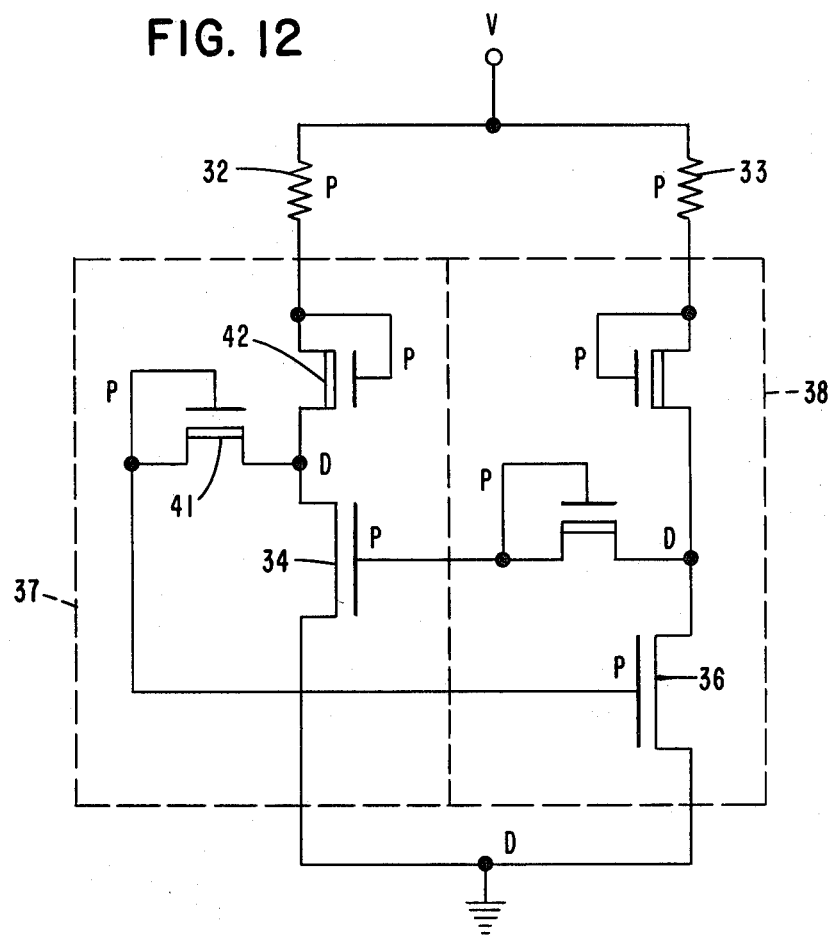
FIG. 12 schematically depicts a flip-flop organization of the IGFETs in FIG. 11.

With this in mind, consider the flip-flop circuit schematically illustrated in FIG. 12. The various electrical nodes in the circuit are also marked by symbols P and D, respectively indicating poly conductive paths and conductive paths diffused, or possibly implanted, into the substrate itself. In a manner typically used, the supply voltage, V, and ground potential are connected via similarly doped conductive paths within the substrate. Preferably, resistors 32 and 33 are selectively doped segments of poly, but with the extent of doping significantly less than dose of the interconnect poly.

Principal IGFETs 34 and 36 are shown with their accompanying parasitic depletion IGFETs within dashed perimeter lines 37 and 38. For instance, the diffused S/D electrode of principal IGFET 34 is electrical coupled through parasitic IGFETs 41 and 42 to a distinct set of interconnect poly electrodes, which themselves lead to respective connections with the gate electrode of principal IGFET 36 and resistor 32. Note the general compatability of the coupling at both the poly and diffused electrode levels. It is no doubt apparent that the flip-flop circuit configuration described takes full advantage of the contact forming process disclosed herein, under preferred operating conditions and without sacrifices in circuit or process complexity.

Though it was noted hereinbefore that the use of parasitic depletion IGFETs to couple the interconnect poly electrodes to the S/D regions is preferably limited to small current loads, this limitation is not nearly as restrictive as may be initially perceived. No doubt it is recognized that the concentration of phosphorus ions implanted may be increased to raise the current carrying capacity of the channel. Principally, however, it should be noted that the preferred process creates a parasitic channel with an effectively large width-to-length ratio. The channel, shown by projection 39 in FIG. 10, includes three contiguous sides for coupling the contact cut area to the S/D region. The higher ratios provide greater current carrying capacity. Since the channel shape shown is merely illustrative, one undoubtedly recognizes that the contact cut and the S/D regions, as well as the implant regions, may be altered to change the shape and thereby the electrical characteristics of the effective channel.

Among the variants contemplated for the embodiment described herein are processes differing in materials and dopant types. Furthermore, as one may recognize, the structure illustrated is suitable for uses other than connections between a poly interconnect layer and a S/D electrode of an IGFET. For instance, the doped region described as a S/D electrode, in FIG. 9, could serve equally well as a conductive path in the substrate layer.

An additional example of a contemplated embodiment extends the foregoing process to one in which a second dielectric layer, separating the first poly layer from a second poly layer, is formed after the first poly layer has been patterned. The second dielectric layer serves as the barrier during the etching of the pattern in the second poly layer. As was true of the single poly layer process, exposed dielectric is removed before the multiple poly layers and substrate are simultaneously doped. In another form of practicing this embodiment, the second dielectric layer is a sandwiched composite of materials such as silicon dioxide and silicon nitride. This refinement of the process steps leads to a sequence of manufacturing which is compatible with the formation of MNOS devices and IGFETs on a common wafers.

In view of the foregoing, it is understood that various modifications can be made to such embodiments without departing from the scope and spirit of the claimed invention.

We claim:

1. A process for making a contact to electrically connect a first dopable interconnect layer with a dopable region in a semiconductor substrate, comprising the steps of:
    defining a first region on said substrate, said first region being adjacent said dopable region in said substrate and covered by a first dielectric layer;
    implanting said defined first region with a dopant of a first impurity type to a concentration adequate to form a depletion mode channel;
    removing a segment of said first dielectric layer to expose a segment of said substrate within said defined first region;
    depositing a first dopable interconnect layer to completely cover said exposed segment of said substrate;
    etching said first dopable interconnect layer to retain a segment within said defined first region without exposing said segment of substrate;
    removing exposed areas of first dielectric layer; and
    doping said first interconnect layer, said dopable region in said substrate, and said exposed segment of said substrate through said first interconnect layer, with a dopant of first impurity type.

2. The process recited in claim 1, wherein said first dielectric layer is composed of a material which does not constitute a barrier to said implanting with a dopant of the first impurity type, does constitute a relative barrier to said doping with a dopant of the first impurity type, and does constitute a relative barrier to etchants used to etch said first dopable interconnect layer.

3. The process recited in claim 2, wherein said dopable region in said substrate defines a source/drain electrode of an IGFET.

4. The process recited in claim 3, wherein said substrate and said first interconnect layer are comprised of silicon, and said first dielectric layer is silicon dioxide.

5. The process recited in claim 4, wherein said impurity of the first type is an n-type dopant.

6. The processes recited in claims 1, 2, 3, 4 or 5, wherein said removed segment of said first dielectric layer is patterned so that said segment is substantially encircled by said dopable region in said substrate.

* * * * *